United States Patent [19]

Yoshida et al.

[11] Patent Number: 5,231,607
[45] Date of Patent: Jul. 27, 1993

[54] SEMICONDUCTOR MEMORY DEVICE

[75] Inventors: Munehiro Yoshida, Yokohama; Syuso Fujii, Kawasaki, both of Japan

[73] Assignee: Kabushiki Kaisha Toshiba, Kawasaki, Japan

[21] Appl. No.: 599,973

[22] Filed: Oct. 19, 1990

[30] Foreign Application Priority Data

Oct. 19, 1989 [JP] Japan .................................. 1-270381

[51] Int. Cl.[5] ...................... G11C 13/00; H01L 27/10
[52] U.S. Cl. ...................................... 365/226; 365/51
[58] Field of Search ...................... 365/51, 63, 230.03, 365/226

[56] References Cited

U.S. PATENT DOCUMENTS

| | | | |
|---|---|---|---|
| 4,525,809 | 6/1985 | Chiba et al. | 365/51 |
| 4,695,978 | 9/1987 | Itakura | 365/51 |
| 5,007,025 | 4/1991 | Hwang et al. | 365/226 |

FOREIGN PATENT DOCUMENTS

| | | |
|---|---|---|
| 0041844A2 | 12/1981 | European Pat. Off. . |
| 0081368A3 | 6/1983 | European Pat. Off. . |
| 2087183A | 5/1982 | United Kingdom . |

OTHER PUBLICATIONS

Kou Wada and Kazumitsu Takeda, "Master-Slice Layout Design for Emitter Coupled Logic LSI", Review of the Electrical Communication Laboratories, vol. 26, No. 9-10, pp. 1355-1366 (Sep.-Oct. 1978).

L. W. Massengil and S. E. Diehi-Nagle, "Voltage Span Modeling for Very Large Memory Arrays", Nasecode IV, Proceedings of the Fourth International Conference on the Numerical Analysis of Semiconductor Device and Integrated Circuits, pp. 396-404 (Jun. 1985).

Peter W. Cook et al., "μm MOSFET VLSI Technology: Part III—Logic Circuit Design Methodology and Applications, 3093 IEEE Trans. on Electron Devices", vol. ED-26, No. 4, pp. 333-334 (Apr. 1979).

Primary Examiner—Joseph A. Popek
Attorney, Agent, or Firm—Banner, Birch, McKie & Beckett

[57] ABSTRACT

A semiconductor memory device has a memory cell array region, a plurality of signal lines arranged above the memory cell array region, and a plurality of power-supply lines or grounding lines, each of which has a first end and a second end and which are arranged between the signal lines in a similar pattern to that of the signal lines.

15 Claims, 4 Drawing Sheets

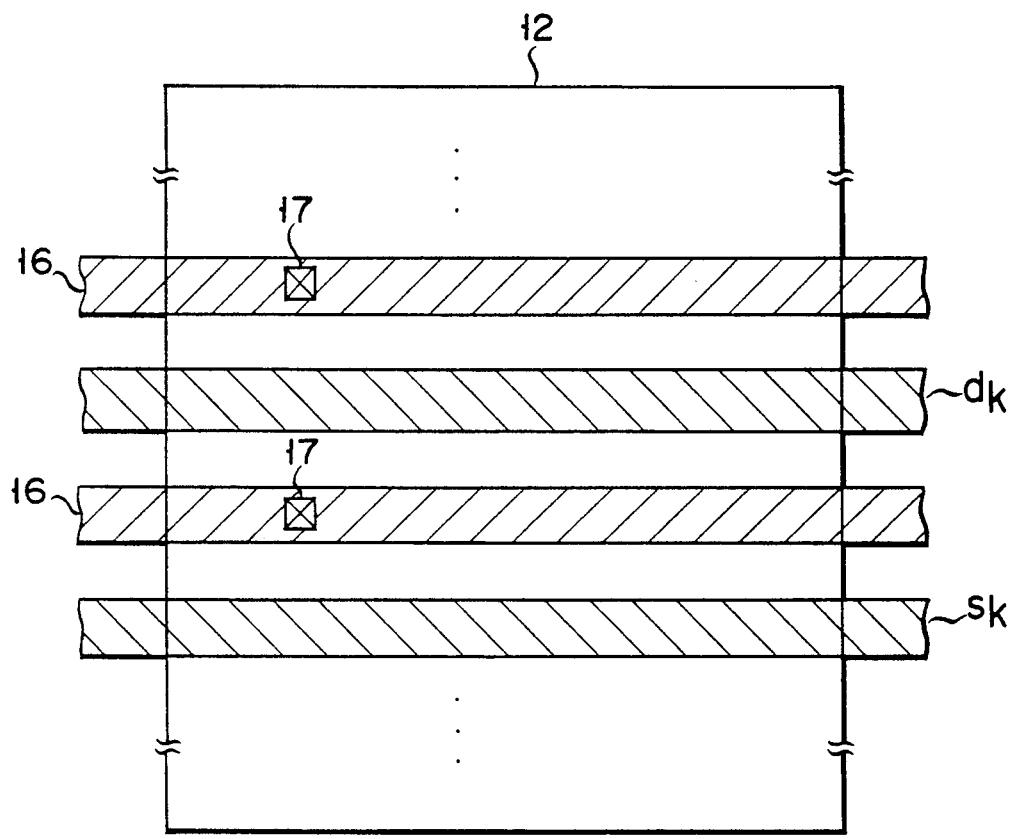
F I G. 3

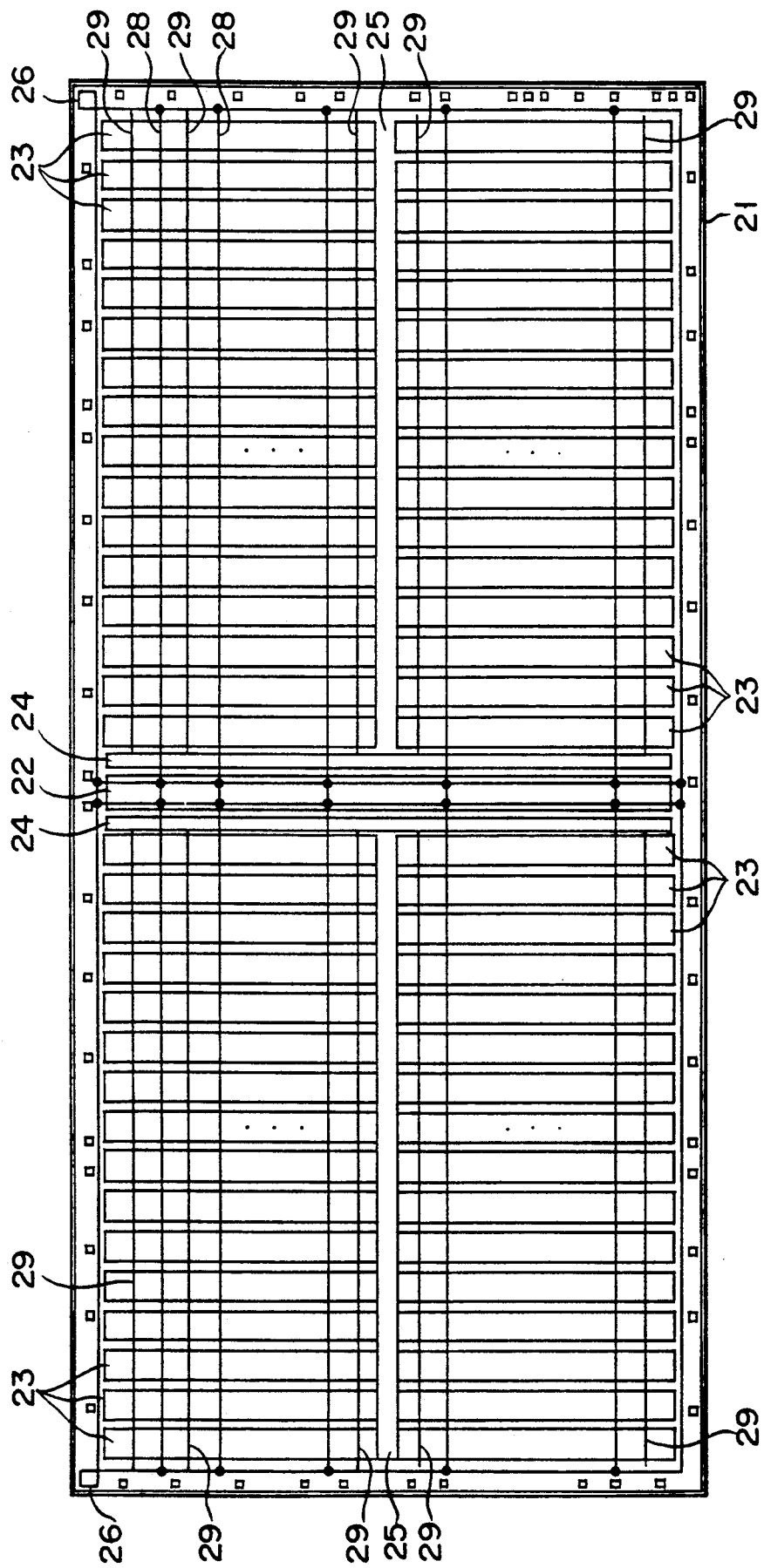
F I G. 4

SEMICONDUCTOR MEMORY DEVICE

BACKGROUND OF THE INVENTION

1. Field of the Invention

The present invention relates to a semiconductor memory device, and more particularly to improvement of a pattern in which the power-supply and grounding lines connected to a peripheral circuit are arranged.

2. Description of the Related Art

The power-supply line and grounding line of a conventional semiconductor device are arranged in such a pattern as is shown in FIG. 1. In FIG. 1, reference numeral 1 denotes a semiconductor chip; 2 and 2' denote memory cell array regions; 3 denotes a peripheral circuit region; 4 denotes a power-supply line; 5 denotes a grounding line; 6 denotes a power-supply pad; and 7 denotes a grounding pad.

As is shown in FIG. 1, two memory cell array regions 2 and 2' are formed on the semiconductor chip 1. The peripheral circuit region 3 is formed between the two memory cell array regions 2 and 2'. A bonding pad region, an input protection circuit region, and other necessary circuit regions are formed in those regions around the memory cell array regions 2 and 2', except for the peripheral circuit region 3. (For simplicity, the bonding pad region, the input protection circuit region, and other necessary circuit regions will be collectively referred to as a "bonding pad region", unless otherwise indicated.)

The power-supply line 4 and the grounding line 5 are formed in the regions around the memory cell array regions 2 and 2', so as to supply a power-supply or ground potential to the peripheral circuit region 3 and the bonding pad region. In other words, the power-supply line 4 and the grounding line 5 are connected to both the peripheral circuit region 3 and the bonding pad region. The power-supply line 4 is also connected to the power-supply pad 6, while the grounding line 5 is also connected to the grounding pad 7.

In the pattern mentioned above, the power-supply line 4 and the grounding line 5 are arranged in the regions around the memory cell array regions 2 and 2'. Consequently, they occupy a certain area on the regions around the memory cell array regions 2 and 2'. In addition, they are required to have a certain width throughout the length, because a stable power-supply potential has to be applied even to their terminating points. If their widths are decreased, the impedance of the lines will increase, with the result that the potential necessary for a normal operation of the peripheral circuits will not be supplied. Moreover, the semiconductor memory device has to employ a larger chip in accordance with an increase of the capacity of the device. Therefore, the power-supply line 4 and the grounding line 5 arranged around the memory cell arrays 2 and 2' have been lengthened year by year. In accordance with this tendency, an increase in the resistance of the wiring lines has become a problem. In other words, the power-supply line 4 and the grounding line 5 arranged around the memory cell arrays 2 and 2' have to be widened in accordance with the increase in the capacity. Since, therefore, the power-supply line 4 and the grounding line 5 require a wide installation area, the size of the semiconductor chip is difficult to reduce.

SUMMARY OF THE INVENTION

The present invention has been developed to solve the problems mentioned above, and its object is to provide a semiconductor memory device, wherein a power-supply line and a grounding line occupy only a very small installation area even in the case where they are arranged in the regions around the memory cell array regions, and wherein a power-supply or ground potential can be supplied in a stable manner even to the terminating ends of the power-supply and grounding lines.

To achieve this object, the present invention provides a semiconductor memory device which comprises: a memory cell array region; a plurality of signal lines arranged above the memory cell array region; and a plurality of power-supply lines and grounding line regularly arranged between the signal lines in a similar pattern to that of the signal lines.

The present invention also provides a semiconductor device which comprises: at least two memory cell array regions; a peripheral circuit region located between the memory cell array regions; a plurality of signal lines arranged above the memory cell array regions; and a plurality of power-supply lines and grounding lines which are regularly arranged between the signal lines in a similar pattern to that of the signal lines and which are connected to the peripheral circuit region.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 3 is an enlarged schematic view showing how the power-supply line and the grounding line are arranged above a memory cell array region; and FIG. 4 is a schematic view of a 16-M DRAM to which the semiconductor memory device of the embodiment is applied.

DETAILED DESCRIPTION OF THE PREFERRED EMBODIMENTS

One embodiment of the present invention will now be described in detail, with reference to the accompanying drawings.

Figure 1:
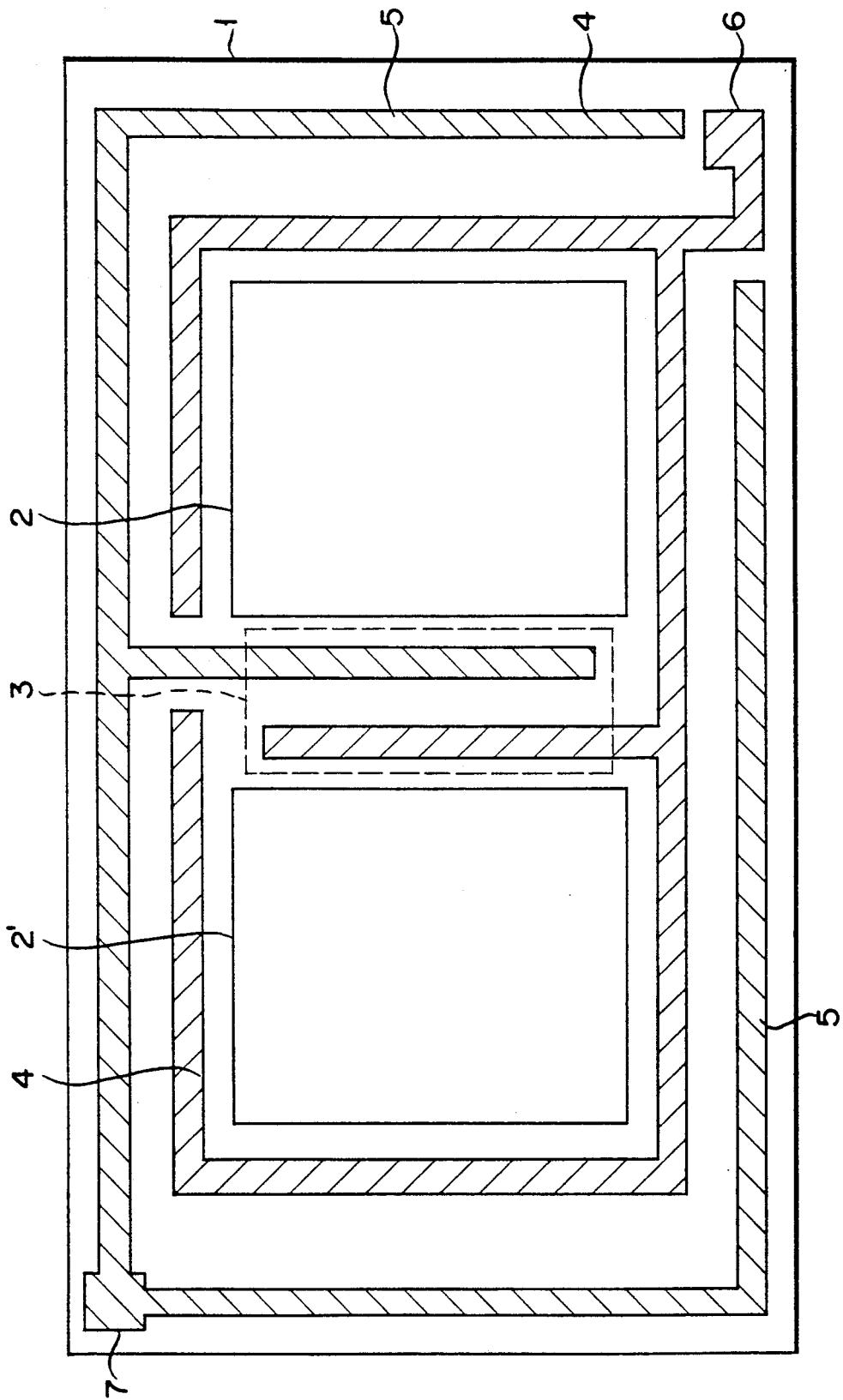
FIG. 1 is a schematic view showing how a power-supply line and a grounding line are arranged in a conventional semiconductor memory device.
Figure 2:
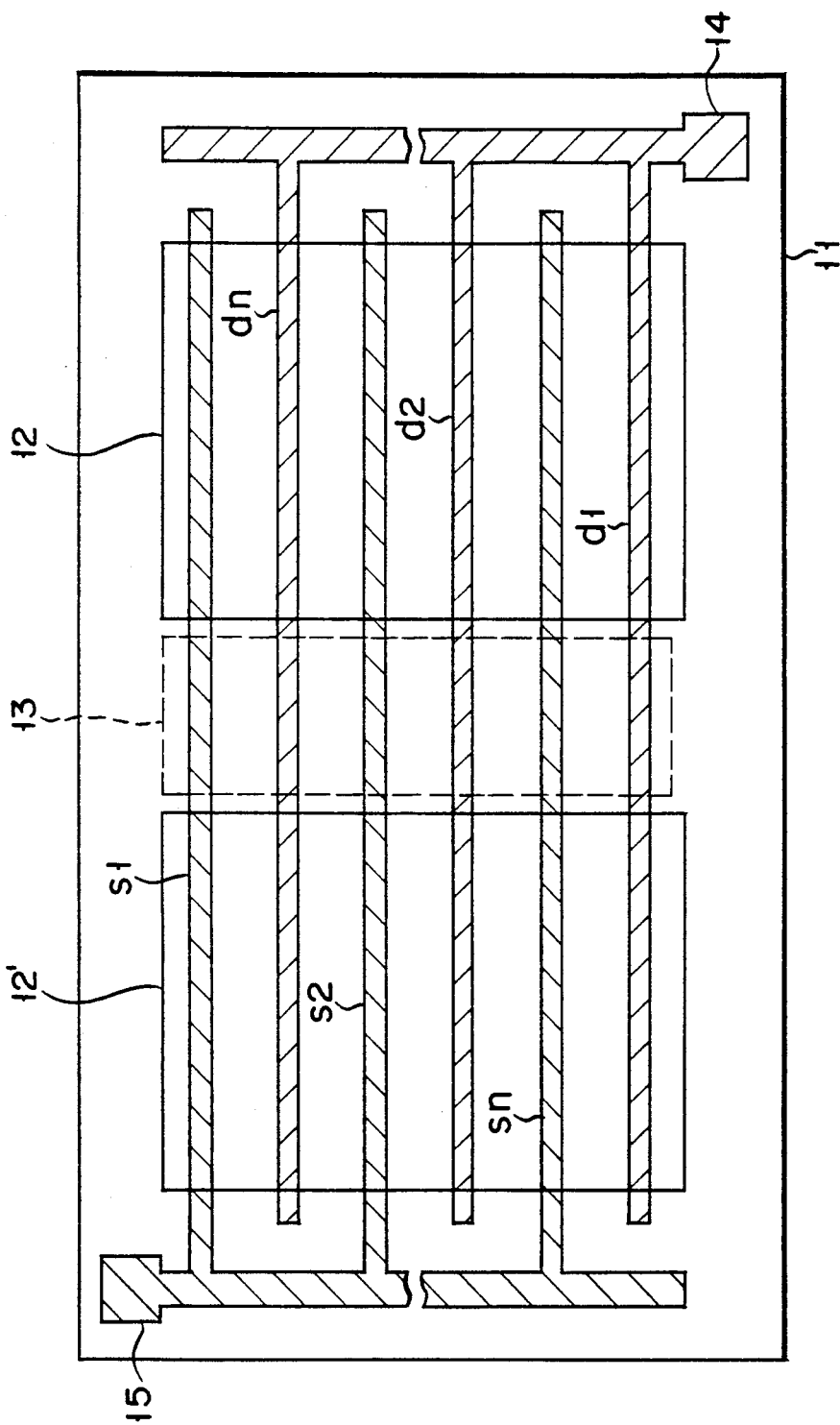
FIG. 2 is a schematic view showing how a power-supply line and a grounding line are arranged in a semiconductor memory device according to on embodiment of the present invention.

FIG. 2 is a schematic view showing how a power-supply line and a grounding line are arranged in the embodiment of the present invention. In FIG. 2, reference numeral 11 denotes a semiconductor chip; 12 and 12' denote memory cell array regions, respectively; 13 denotes a peripheral circuit region; 14 denotes a power-supply pad; 15 denotes a grounding pad; d1, d2, ... dn denote power-supply lines, respectively; and s1, s2, ... sn denote grounding lines, respectively.

As is shown in FIG. 2, the semiconductor chip 12 has e.g. two memory cell array regions 12 and 12'. The peripheral circuit region 13 is located between these two memory cell array regions 12 and 12'. In the regions located around the memory cell array regions 12 and 12', a bonding pad region is formed. The power-supply pad 14 and the grounding pad 15 are connected to this bonding pad region.

The power-supply lines d1, d2, ... dn are connected at one end to the power-supply pad 14 and are regularly arranged above the memory cell array regions 12 and 12'. It should be noted that the power-supply lines d1, d2, ... dn are electrically connected not to memory cell arrays but to the peripheral circuit region 13 located between the memory cell array regions 12 and 12'. It is preferable that the power-supply lines d1, d2, ... dn be connected together above the peripheral circuit region 13. If necessary, the power-supply lines d1, d2, ... dn may be also connected together at their terminating ends.

The grounding lines s1, s2, ... sn are connected at one end to the grounding pad 15 and are regularly arranged above the memory cell array regions 12 and 12'. It should be noted that the grounding lines s1, s2, ... sn are electrically connected not to the memory cell arrays but to the peripheral circuit region 13. It is preferable that the grounding lines s1, s2, ... sn be connected together on the peripheral circuit region 13. If necessary, the grounding lines s1, s2, ... sn may be also connected together at their terminating ends.

In the wiring arrangement mentioned above, the power-supply lines d1, d2, ... dn and the grounding lines s1, s2, ... sn, which are arranged above the memory cell array regions 12 and 12', are connected to the peripheral circuit region 13 located between the memory cell array regions 12 and 12'. With this arrangement, the power-supply and grounding lines do not require a wide installation area in the regions around the memory cell array regions 12 and 12'; the installation area can be narrow as long as the power-supply and grounding lines allow a sufficient power-supply or ground potential to an input protection circuit or other circuits. That is, the installation area around the memory cell array regions 12 and 12' can be reduced, thus enabling the use of a small-sized chip.

Moreover, each of the power-supply lines d1, d2, ... dn need not be widened since the number of power-supply lines d1, d2, ... dn can be increased instead. Likewise, each of the grounding lines s1, s2, ... sn need not be widened since the number of grounding lines s1, s2, ... dn can be increased instead. Accordingly, the impedance of each power-supply line and that of each grounding line are low. As a result, a stable power-supply potential can be supplied even to the terminating ends of the power-supply lines d1, d2, ... dn, and a stable ground potential can be supplied even to the terminating points of the grounding lines s1, s2, ... sn.

In the case where the input protection circuit and other circuits are not formed around the memory cell array regions 12 and 12', the power-supply lines d1, d2, ... dn and the grounding lines s1, s2, ... sn need not be arranged around the memory cell array regions 12 and 12'. Accordingly, the installation area for them can be completely eliminated from around the memory cell array regions 12 and 12'.

FIG. 3 is a schematic view which illustrates, in a large scale, the power-supply and grounding lines arranged above one memory cell array region. In FIG. 3, reference numeral 16 denotes a column-selecting line; 17 denotes a contact hole through which the column-selecting line 17 and a memory cell array are connected to each other; dk denotes a power-supply line; sk denotes a grounding line.

As is shown in FIG. 3, the column-selecting lines 16 (i.e., signal lines) are regularly arranged on the memory cell array region 12, and are connected to the memory cell array through the contact holes 17. The power-supply line dk and/or the grounding line sk are regularly arranged between the adjacent ones of the column-selecting lines 16 in a similar pattern to that of the column-selecting lines 16. For example, the power-supply line dk and the grounding line sk are alternately arranged between the column-selecting lines 16. It should be noted that the power-supply line dk and the grounding line sk are not connected to the memory cell array.

As mentioned above, the power-supply lines dk and the grounding lines sk are regularly arranged in a similar pattern to that of the column-selecting lines 16. With this arrangement, the power-supply and grounding lines dk and sk arranged above the memory cell array region 12 do not result in a dispersion in the parasitic capacitance of bit lines formed under the column-selecting lines 16. Since, therefore, little noise is generated in the bit lines, the reading of information is in no way adversely affected.

The power-supply line dk and the grounding line sk need not be alternately arranged; both of them may be regularly arranged between the adjacent ones of the column-selecting lines 16. Even where both the power-supply line dk and the grounding line sk are arranged between two adjacent column-selecting lines 16, the advantages arising from this arrangement are substantially the same. Moreover, the power-supply line dk and the grounding line sk may be arranged between column signal reading/writing lines or the like, not between the column-selecting lines 16.

FIG. 4 is a schematic view showing a 16-M DRAM to which the semiconductor memory device of the embodiment is applied. In FIG. 4, reference numeral 21 denotes a semiconductor chip; 22 denotes a peripheral circuit region; 23 denotes a memory cell array; 24 denotes a column decoder region; 25 denotes a row decoder region; 26 denotes a grounding pad; 28 denotes a grounding line; and 29 denotes a column-selecting line.

In the embodiment mentioned above, both the power-supply lines d1, d2, ... dn and the grounding lines s1, s2, ... sn are arranged above the memory cell array regions 12 and 12'. However, either the power-supply lines d1, d2, ... dn or the grounding lines s1, s2, ... sn may be arranged above the memory cell array regions 12 and 12'. Moreover, the power-supply lines d1, d2, ... dn may be applied with a power-supply potential reduced inside the chip, instead of being applied with a power-supply potential supplied from the power-supply pad 14.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device, comprising:
   a semiconductor chip;
   a memory cell array region on said semiconductor chip including a memory cell array having memory cells;

signal lines arranged on a surface of said semiconductor chip above said memory cell array;

power conductor lines arranged on a surface of said semiconductor chip above said memory cell array, each of said power conductor lines having a first end, a second end, and a portion extending between adjacent ones of said signal lines, the first ends of said power conductors connected together and the second ends of said power conductors connected together.

2. A semiconductor memory device according to claim 1, wherein at least one of the first and second ends of each power conductor is connected to a power conductor pad.

3. A semiconductor memory device according to claim 1, wherein said signal lines are column-selecting lines.

4. A semiconductor memory device according to claim 1, wherein said signal lines are column signal reading/writing lines.

5. The semiconductor memory device according claim 1, wherein said power conductor lines include power-supply lines.

6. The semiconductor memory device according to claim 1, wherein said power conductor lines include ground lines.

7. The semiconductor memory device according to claim 1, wherein said signal lines are signal lines for supplying signals to memory cells of said array.

8. A semiconductor memory device, comprising:
a semiconductor chip;
two memory cell array regions on said semiconductor chip each including a memory cell array having memory cells;
a peripheral circuit region between said two memory cell array regions;
signal lines arranged on a surface of said semiconductor chip above said memory cell array regions;
a first arrangement of power-supply lines, each of which has a first end, a second end, and a portion disposed between adjacent ones of said signal lines and each of which is connected to said peripheral circuit region; and
a second arrangement of ground lines, each of which has a first end and a second end, and a portion disposed between adjacent ones of said signal lines and each of which is connected to said peripheral circuit region, wherein both the first and second ends of each line in at least one of said first and second arrangements are respectively connected together.

9. A semiconductor memory device according to claim 8, wherein at least one of the first and second ends of each power-supply line is connected to a power-supply pad.

10. A semiconductor memory device according to claim 8, wherein at least one of the first and second ends of each ground line is connected to a ground pad.

11. A semiconductor memory device according to claim 8, wherein said power-supply lines are connected to one another above the peripheral circuit region.

12. A semiconductor memory device according to claim 8, wherein said ground lines are connected to one another above the peripheral circuit region.

13. A semiconductor memory device according to claim 8, wherein said signal lines are column-selecting lines.

14. A semiconductor memory device according to claim 8, wherein said signal lines are column signal reading/writing lines.

15. The semiconductor memory device according to claim 10, wherein one of said power supply lines and one of said ground lines are arranged between adjacent ones of said signal lines.

* * * * *